United States Patent [19]

Cole et al.

[11] Patent Number: 4,859,951

[45] Date of Patent: Aug. 22, 1989

[54] DETECTING FAULTS IN TRANSMISSION LINES EMPLOYING AN ECHO CANCELLATION SIGNAL

[75] Inventors: Nigel G. Cole, Saxmundham; Peter F. Adams, Ipswich, both of England

[73] Assignee: British Telecommunications, London, England

[21] Appl. No.: 111,049

[22] Filed: Oct. 21, 1987

[30] Foreign Application Priority Data

Oct. 22, 1986 [GB] United Kingdom ............... 8625282

[51] Int. Cl.$^4$ ............................................. G01R 31/11
[52] U.S. Cl. ....................................... 324/534; 379/26
[58] Field of Search ............... 324/534, 532, 533, 521, 324/58.5 B, 58 B; 379/3, 26, 406, 410, 411; 370/231, 32; 364/507, 522

[56] References Cited

U.S. PATENT DOCUMENTS 4,064,379 12/1977 Horna .................................. 379/411
4,072,830 2/1978 Gitlin et al. ......................... 379/411
4,649,335 3/1987 Lassaux et al. ................... 379/26 X

FOREIGN PATENT DOCUMENTS 0111832 6/1984 European Pat. Off. .
2040147 8/1980 United Kingdom .

OTHER PUBLICATIONS

Patent Abstracts of Japan, vol. 6, No. 75, (P-114)[053], 12th May 1982; & JP-A-57, 12 493 (Kokusai Denki).

Primary Examiner—Reinhard J. Eisenzopf
Assistant Examiner—Robert W. Mueller
Attorney, Agent, or Firm—Nixon & Vanderhye

[57] ABSTRACT

A variation in the cancellation coefficents of an echo cancelling modem indicate a change in the impedance of a line. In an echo canceller with T spaced samples (i.e. producing a cancellation signal at the data rate) the resolution is too poor to provide satisfactory identification of faults. A set of coefficients is stored and the sampling phase adjusted to produce a second set. This may be repeated producing eight sets in the preferred embodiment. A higher resolution picture of the line impedance is built up allowing comparisons with an earlier or optimum set of values. The test facility may be included in an operating modem providing line test facilities when not transmitting data.

9 Claims, 2 Drawing Sheets

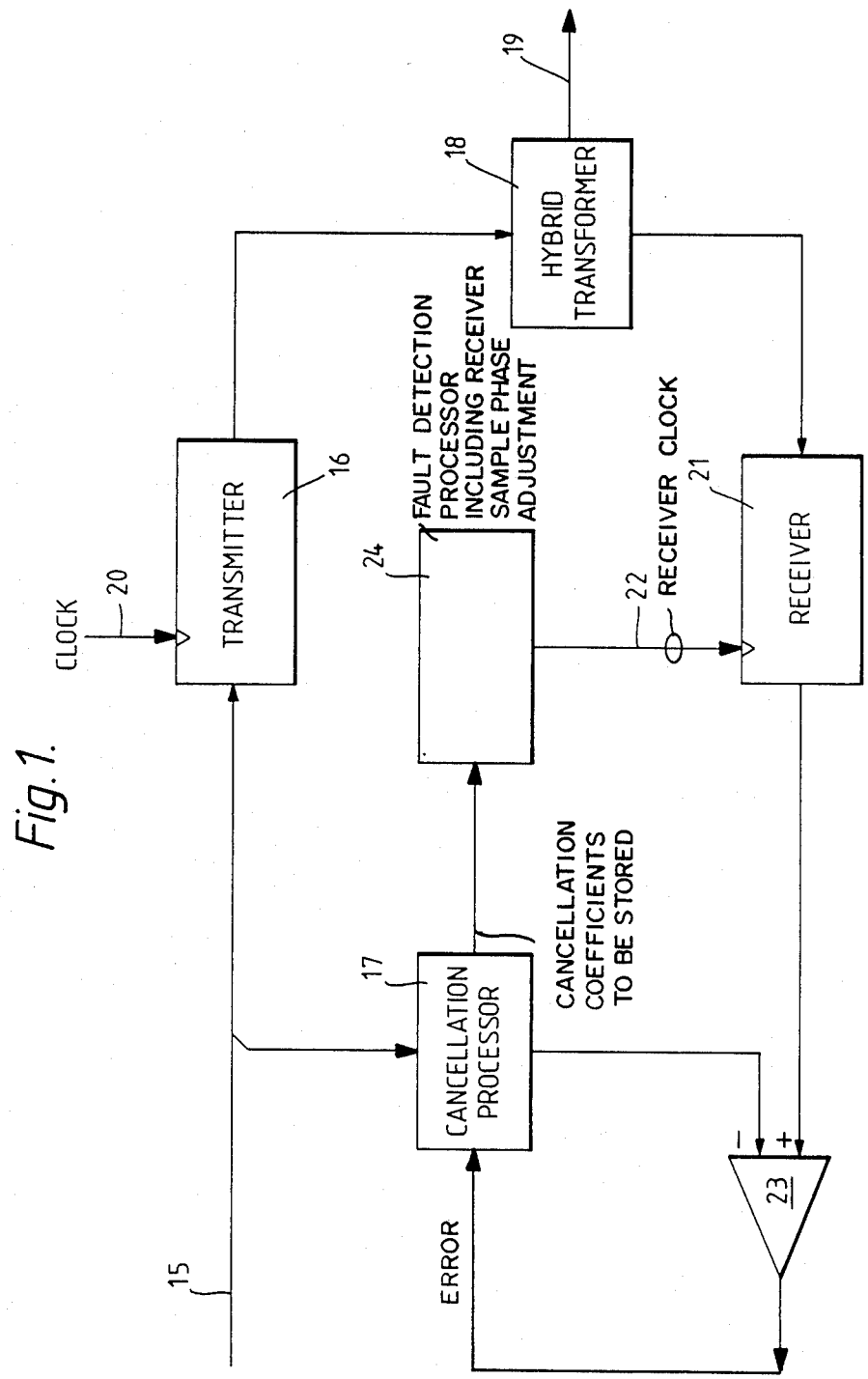

DETECTING FAULTS IN TRANSMISSION LINES EMPLOYING AN ECHO CANCELLATION SIGNAL

The present invention relates to a method of detecting faults in transmission lines and an apparatus for carrying out the method.

The apparatus for detecting faults in transmission lines is of the type comprising means for supplying a sequence of output pulses to a wire, means for receiving echos of said pulses from said wire and an adaptive cancellation processor arranged to produce a cancellation signal in response to each output pulse.

An apparatus of the aforesaid type is disclosed in an article by G Shorrock in Electronic Letters, Volume 20 NI of January 1984 titled "Line Fault Prediction and Location in Echo Cancelling Data Transmission Systems". The article describes how the set of coefficients calculated by the cancellation processor (by an adaptive algorithm) may be compared with a reference set. If the coefficients have changed then the impedance of the line has changed which, assuming no intentional changes have been made, indicates that a fault has occurred on the line.

The above technique not only indicates that the line has a fault but, given some knowledge of the line characteristics, it also indicates the position of the fault along the line. The resolution of the system depends on the tap spacing which, in the above known system, for example, is 2.5 Microsecond.

A problem with this technique is that the trend has been towards using cancellation processors which have a tap spacing T equal to the reciprocal of the data rate. An example of such a system is described in European Patent Application No 23151 assigned to the assignee of the present application. In this system the tap spacing is 6.25 microsecond which, although providing satisfactory cancellation, is not suitable for employing the fault detection technique described by Shorrock.

According to the present invention there is provided an apparatus of the aforesaid type characterised in that a first set of coefficients are stored, the sample phase of the cancellation signal is adjusted to produce a second set of cancellation coefficients and said first and second sets of coefficients are compared with a reference set to determine whether a fault has occurred to the line.

An advantage of the present invention is that the number of coefficients available for fault detection purposes has been increased without increasing the number of coefficients which require adapting in real-time.

The invention will now be described by way of example only with reference to the accompanying drawings of which:

FIG. 1 shows a modem incorporating an echo cancellation processor; and

Figure 2A:
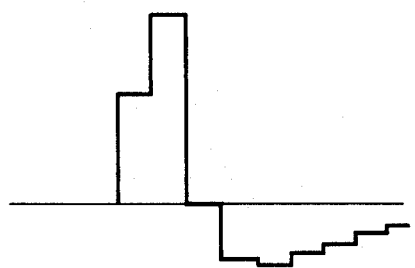
FIGS. 2A, 2B, 2C and 2D show cancellation coefficients plotted against time.

A modem for transmitting and simultaneously receiving data over a twisted pair of wires is shown in FIG. 1. Data on a line 15 is supplied to a transmitter 16 and a cancellation processor 17. The data is coded by the transmitter and supplied to a hybrid 18 for transmission over a twisted pair of wires 19. The transmitter 16 receives clock pulses on a line 20 while similar pulses are supplied to a receiver 21 via a line 22. The receiver 21 converts a distorted multilevel signal into a digital code from which a cancellation signal, from the cancellation processor 17, is subtracted by a subtractor 23. The output from subtractor 23 provides an error signal to the cancellation processor 17 which in turn attempts to minimise the value of this error.

The cancellation processor includes a transversal digital filter which may have a simple linear structure or arranged to model non linear functions as described in European Patent Applications Nos 152172 and 203726 assigned to the assignee of the present application.

The stored coefficients represent the impedance characteristics of the line and may be plotted in their quantised form as shown in FIG. 2A. This response was obtained for a 100R resistor in series with a wire at a distance of 3KM from the transmitter and generated as a cancellation signal in response to an output of a unit pulse. The interval between samples is 12.5 microsecond and the resolution is not good enough to provide effective fault detection.

In addition to operating in normal (full duplex transmission) mode, the modem may also operate in a fault detection mode. Returning to FIG. 1 the modem includes a fault detection processor 24 which supplies clock pulses to the receiver 21. In normal operation the sampling phase of the receiver is adjusted to obtain optimum sampling. In its fault detection mode no information is received but a series of unit pulses are transmitted. The sample phase of the receiver is therefore set at a predetermined phase with respect to the transmitter and the cancellation processor calculates a first set of co-efficients during an initial training period. Once the error signal reaches an acceptable level this first set of coefficients are supplied to the detection processor 24 where they are stored. The fault detection processor now adjusts the sample phase of the receiver by T/8 and the coefficients in the cancellation processor re-adapt. Again the error signal reaches an acceptable level and a second set of coefficients are supplied to the fault detection processor. This procedure is repeated until eight sets of coefficients have been supplied to the fault detection processor.

Figure 2B:
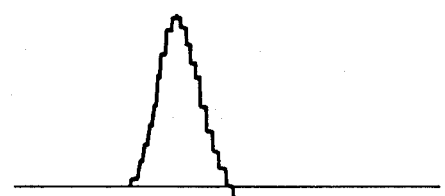

During each sample period, during a fault detection cycle, the output pulses are substantially the same and the resulting echo is the same. The coefficient values from the eight sets are therefore interleaved to generate an echo response with greater resolution, as shown in FIG. 2B. These values may then be compared with a reference set to deduce whether a fault exists on the line.

Figure 2C:
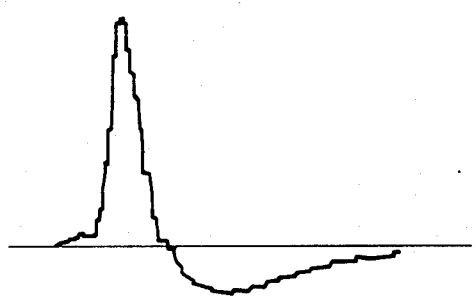
Figure 2D:
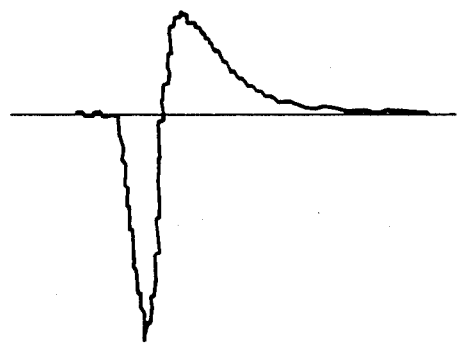

The position of a rising edge indicates the position of a fault and its sense indicates whether the fault is an open circuit or a short circuit. FIG. 2C shows the response of a open circuit at 3Km and FIG. 2D shows short circuit at the same distance.

The system could provide the basis for a fault detection apparatus which is selectively connected to a line to detect faults. However the system could also be incorporated into modems and a line test routine could run intermittantly when the line is not in use. The system can therefore detect a fault before a line becomes totally inoperable and automatically transfer this information to a diagnostic sub-system at the exchange. Alternatively using low level pulse transmission for test purposes, line analysis may be carried out without affecting the transmission of "live" traffic.

While as herein before described, the reference set of characteristics are derived by practical testing, it will be appreciated that an optimum characteristic reference set may be derived theoretically for use in testing newly installed lines.

We claim:

1. Fault detection apparatus for detecting faults in transmission lines comprising:

supplying a sequence of output pulses to a wire, receiver means for receiving echoes of said pulses from said wire using a sample clock rate of 1/T and an adaptive cancellation processor arranged to produce a cancellation signal in response to each output pulse, said apparatus further including a fault detection processor, said fault detection processor being arranged to receive N sets of cancellation coefficients from said cancellation processor, each of said sets of cancellation coefficients being derived by adjusting the sample clock phase of the receiver means and hence of the cancellation signal by T/N, said fault detection processor interleaving said N sets of coefficients to derive an overall coefficient set representing line characteristics at N times sample rate 1/T, said overall set of coefficients being compared with a stored reference set to determine whether a fault has occurred on the line.

2. Fault detection apparatus according to Claim 1 in which the coefficients from each of said N sets are interleaved and displayed graphically.

3. Fault detection apparatus according to claim 1 in which said phase is adjusted seven times and N=8.

4. A method of detecting faults in transmission lines comprising steps of:

supplying a sequence of output pulses to a wire, receiving echoes of said pulses from said wire and producing a cancellation signal in response to each output pulse, adjusting the sample clock using a sample clock rate 1/T phase used to produce the cancellation signal (N - 1) times to produce N sets of cancellation coefficients, interleaving said N sets of cancellation coefficients to produce an overall set of cancellation coefficients at N times the sample clock rate and comparing said overall set of coefficients to determine whether a fault has occurred on the line.

5. A method according to claim 4 in which the phase of the cancellation signal is adjusted relative to the phase of the output pulses.

6. A method according to claim 4 in which the relative phase is adjusted seven times to produce eight sets of cancellation coefficients.

7. A method according to claim 6 in which the coefficients are interleaved and displayed graphically.

8. Transmission line fault detecting apparatus comprising:

transmitter means for launching repetitive pulses onto a transmission line;

receiver means connected to receive resulting pulse echoes from said transmission line and to calculate a set of echo cancellation coefficients using supplied clock pulses of controllable phase and a transversal filter with tap spacings of T seconds; and a fault detection processor means for controllably changing the phase of said clock pulses by an increment of less than T seconds between successive cycles of calculation and storage of said cancellation coefficients thereby providing plural sets of stored coefficients which can be interleaved into a composite set having a resolution interval of less than T.

9. Transmission line detecting method comprising:

launching repetitive pulses onto a transmission line;

receiving resulting pulse echoes from said transmission line and calculating a set of echo cancellation coefficients using supplied clock pulses of controllable phase and a transversal filter with tap spacings of T seconds; and controllably changing the phase of said clock pulses by an increment of less than T seconds between successive cycles of calculation and storage of said cancellation coefficients thereby providing plural set of stored coefficient which can be interleaved into a composite set having a resolution interval of less than T.

* * * * *